(12) United States Patent
Lam

(10) Patent No.: US 7,343,015 B2
(45) Date of Patent: Mar. 11, 2008

(54) METHOD AND APPARATUS FOR HIGH FIDELITY WIRELESS STEREOPHONIC TRANSMISSION UTILIZING DUAL FREQUENCY CARRIERS

(75) Inventor: Man Tai Vincent Lam, New Territories (HK)

(73) Assignee: Radio Shack Corporation, Fort Worth, TX (US)

( * ) Notice: Subject to any disclaimer, the term of this patent is extended or adjusted under 35 U.S.C. 154(b) by 1358 days.

(21) Appl. No.: 09/871,268

(22) Filed: May 31, 2001

(65) Prior Publication Data

US 2002/0006205 A1    Jan. 17, 2002

Related U.S. Application Data

(63) Continuation-in-part of application No. 09/441,422, filed on Nov. 16, 1999, now Pat. No. 6,658,115.

(51) Int. Cl.
*H04H 5/00* (2006.01)
*H04B 7/00* (2006.01)
*H04B 1/02* (2006.01)

(52) U.S. Cl. .................... 381/2; 455/103; 455/209; 381/14

(58) Field of Classification Search .............. 455/102, 455/103
See application file for complete search history.

(56) References Cited

U.S. PATENT DOCUMENTS

| 2,233,183 A * | 2/1941 | Roder .................. 332/123 |
| 2,654,806 A | 10/1953 | Wilmotte |
| 2,779,020 A * | 1/1957 | Wilmotte .................. 381/3 |
| 3,317,838 A | 5/1967 | Ham, Jr. |
| 3,787,629 A * | 1/1974 | Limberg .................. 381/5 |
| 4,310,920 A * | 1/1982 | Hayes .................. 370/204 |
| 4,380,822 A * | 4/1983 | Broton .................. 455/80 |
| 4,605,902 A * | 8/1986 | Harrington .............. 327/355 |
| 4,612,668 A | 9/1986 | Sarac .................. 455/120 |
| 4,710,814 A | 12/1987 | Gassmann et al. .......... 358/143 |
| 4,829,500 A | 5/1989 | Saunders .................. 369/5 |
| 4,829,570 A | 5/1989 | Schotz .................. 381/3 |
| 4,845,751 A | 7/1989 | Schwab .................. 381/25 |
| 4,876,710 A | 10/1989 | Reed et al. .................. 379/63 |
| 4,916,532 A | 4/1990 | Streck et al. .................. 358/83 |
| 4,933,921 A | 6/1990 | Saunders .................. 369/5 |
| 5,023,931 A | 6/1991 | Streck et al. .................. 455/21 |
| 5,038,402 A | 8/1991 | Robbins .................. 455/3 |
| 5,045,948 A | 9/1991 | Streck et al. .......... 358/194.1 |
| 5,047,860 A | 9/1991 | Rogalski .................. 358/198 |
| 5,134,630 A | 7/1992 | Bateman .................. 375/1 |
| 5,272,525 A | 12/1993 | Borchardt et al. ............ 358/83 |
| 5,299,264 A | 3/1994 | Schotz et al. .................. 381/14 |
| 5,349,386 A | 9/1994 | Borchardt et al. .......... 348/485 |

(Continued)

*Primary Examiner*—Xu Mei
(74) *Attorney, Agent, or Firm*—Dan Brown Law Office; Daniel R. Brown

(57) ABSTRACT

A method and system is disclosed for transmitting two related channels of signals through the air. A first channel of signals is modulated with a first carrier frequency, and a second channel of signals is modulated with a second carrier frequency. The modulated first channel of signals and the second channel of signals are then combined through a high isolation combiner. Thereafter, the combined signals are transmitted toward a receiver system. After receiving the transmitted signals, the first channel and the second channel of signals are regenerated in the receiver system by separating one from the other.

17 Claims, 11 Drawing Sheets

U.S. PATENT DOCUMENTS

| | | | |
|---|---|---|---|
| 5,373,265 A | 12/1994 | Davis et al. | 332/151 |
| 5,410,735 A | 4/1995 | Borchardt et al. | 455/42 |
| 5,446,421 A | 8/1995 | Kechkaylo | 332/100 |
| 5,491,839 A | 2/1996 | Schotz | 455/66 |
| 5,541,959 A | 7/1996 | Myers | 375/348 |
| 5,548,243 A | 8/1996 | Sun et al. | 329/316 |
| 5,581,576 A | 12/1996 | Lanzetta et al. | |
| 5,581,617 A | 12/1996 | Schotz et al. | 381/14 |
| 5,666,658 A | 9/1997 | Borchardt et al. | 455/42 |
| 5,673,323 A | 9/1997 | Schotz et al. | 381/2 |
| 5,781,847 A | 7/1998 | Clarke et al. | |
| 5,822,440 A | 10/1998 | Oltman et al. | 381/82 |
| 5,862,235 A | 1/1999 | Kowalczyk | 381/79 |
| 5,983,078 A | 11/1999 | Bossard | 455/63 |
| 6,100,771 A | 8/2000 | Komiya | 332/103 |
| 6,178,317 B1 * | 1/2001 | Kroeger et al. | 455/296 |
| 6,535,720 B1 * | 3/2003 | Kintis et al. | 455/115.1 |
| 6,658,115 B1 * | 12/2003 | Lam | 381/2 |
| 6,954,534 B2 * | 10/2005 | Pace et al. | 381/2 |

\* cited by examiner

METHOD AND APPARATUS FOR HIGH FIDELITY WIRELESS STEREOPHONIC TRANSMISSION UTILIZING DUAL FREQUENCY CARRIERS

CROSS REFERENCE

This application is a continuation-in-part application of co-pending U.S. patent Ser. No. 09/441,422, entitled "A Method and Apparatus for High Fidelity Wireless Stereophonic Transmission", filed on Nov. 16,1999 and incorporated herein by reference in its entirety.

BACKGROUND OF THE INVENTION

The present invention relates generally to wireless stereophonic speaker or headphone systems, and more particularly to base band signal treatment, local transmission and reception of electromagnetic signals therefor.

Audio and television equipment for home use is becoming increasingly complex, involving multiple programming sources capable of reproducing sound and data with ever increasing fidelity. In the past, speaker/headphone assemblies have been physically connected by cables to the receiver central receiver/player. Such arrangements are unaesthetic if the speaker/headphone is not located near the receiver/player because the wires connecting the speaker/headphone to the receiver/player may be visible. Installing wires under carpet or in the walls in order to hide them can be inconvenient and expensive. Also, wires can be unsafe for use in home entertainment systems in locations not proximate to the source of the acoustic data such as outdoors.

In the present art, traditional wireless headphones and other speaker assemblies employ the use of electromagnetic transmissions with low power to send data from the receiver/player to a receiver located at a speaker or a headphone, thus eliminating the need for the receiver/player and speaker/headphone to be connected by wire leads. Local low power single carrier signal transmission systems implemented in such a wireless headphone/speaker system usually operate within a frequency band of 902 MHz to 928 MHz using Frequency Modulated Multiplex Composite System (FM-MPX) signals. The FM-MPX signal in the single carrier signal transmission system includes the sum (R+L) and difference (L−R) of right and left audio channels in different frequency domains. When the signal is received, complete separation of the right and left audio channel is not feasible, resulting in inferior audio channel separation which deteriorates the stereo effect. Another drawback of such a conventional system is that the demodulation process at the receiver cannot completely eliminate a pilot tone used by the single carrier transmission system, and the residual noise of the pilot tone will distort the information in the transmitted signal. Also, the pilot signal consumes inordinate power, decreasing the efficiency of the transmitter.

Therefore, the use of traditional FM signals in a single carrier transmission system does not adequately reproduce the quality of sound that the receiver/player is capable of transmitting, thus forcing users to compromise the high fidelity of the signals in exchange for the convenience of having a wireless stereophonic headphone or speaker system.

What is needed is an improved method and system for transmitting stereophonic signals wirelessly.

SUMMARY OF THE INVENTION

A method and system is disclosed for transmitting two related channels of signals through the air. In one example, a first channel of signals is modulated with a first carrier frequency, and a second channel of signals is modulated with a second carrier frequency. The modulated first channel of signals and the second channel of signals are then combined through a high isolation combiner. Thereafter, the combined signals are transmitted toward a receiver system. After receiving the transmitted signals, the first channel and the second channel of signals are regenerated in the receiver system by separating one from the other.

The two channels of signals can be two analog channels of signals, two streams of digital data, or a combination of both. Not only are these two channels of signals transmitted wirelessly through the air, there are various other advantages achieved for signal communications such as having high signal-to-noise (S/N) ratio, good frequency response, low signal distortion, high dynamic/frequency range, and reduced base band channel cross-talks.

DESCRIPTION OF THE PREFERRED EMBODIMENT

The present invention provides an improved method for transmitting stereophonic signals by using a dual-carrier data transmission system. FIGS. 1-4 illustrate circuit designs and frequency distributions of signals in a prior art single carrier transmission system. The prior art single carrier transmission system sometimes is referred to in the following description as a MPX system because it uses frequency modulated MPX signals. FIGS. 5-9 illustrate a dual-carrier data transmission system in more detail according to the present invention.

Figure 1:
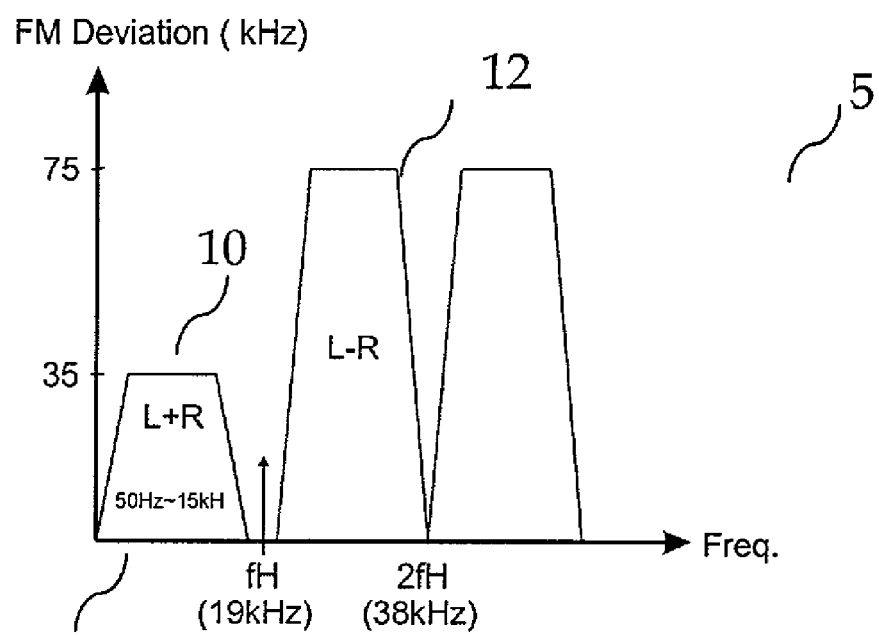
FIG. 1 illustrates a frequency distribution for signals transmitted by a conventional single carrier transmission system.

Referring now to FIG. 1, a diagram 5 is shown illustrating the frequency distribution of signals transmitted by conventional single carrier transmission systems such as an MPX system. Although it is understood that the MPX system is mainly for transmitting audio signals, or more particularly, musical signals, it is contemplated by the present invention that the information disclosed below can be applied to any type of signals.

As it is shown, in order to balance between sound quality effects of both left (L) and right (R) channels, the MPX spectrum includes the sum (L+R) 10 and difference (L−R) 12 of the right and left audio channels in different frequency domains. A pilot tone frequency 14 at $F_H$ is generated between these two frequency domains. The pilot tone frequency is usually set at 19 kHz. Both the left and right audio frequency responses are limited by the existence of the pilot tone. Therefore, the left or right audio channel usually has a frequency spectrum limitation of up to 15 kHz. Also indicated by FIG. 1, the (L−R) signal generated by the MPX system by using a method of Double Side Band Reduced Transmission such as Double Side Band Suppression Carrier (DSB-SC) method has a higher amplitude than that of the (L+R) signal because of the requirement of having a higher Signal-to-Noise (S/N) ratio for the DBS-SC demodulation at the receiver side.

Figure 2:
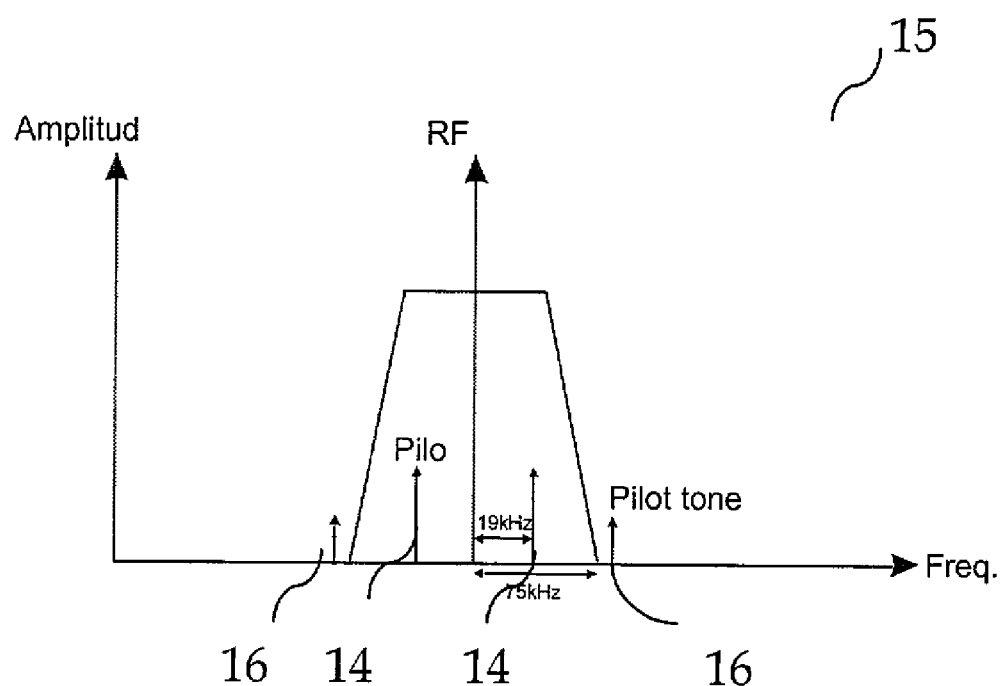
FIG. 2 is illustrates a frequency distribution of a carrier frequency, pilot signals, and pilot tone signals in a conventional single carrier transmission system.

Referring to FIG. 2, a diagram 15 is shown illustrating a frequency distribution of a carrier frequency, pilot signals, and pilot tone signals in a conventional single carrier transmission system. Depicted in a space defined by frequency and amplitude parameters, in a DSB-SC transmission, frequencies produced by amplitude modulation are symmetrically spaced above and below the carrier frequency. In practice, the carrier level is reduced to the lowest practical level, ideally completely suppressed. Such a conventional MPX system can be classified as a single carrier system. It is clearly indicated that the pilot tone harmonic/distortion 16 can never be eliminated mainly because of the inherent features of the MPX system.

Figure 3:
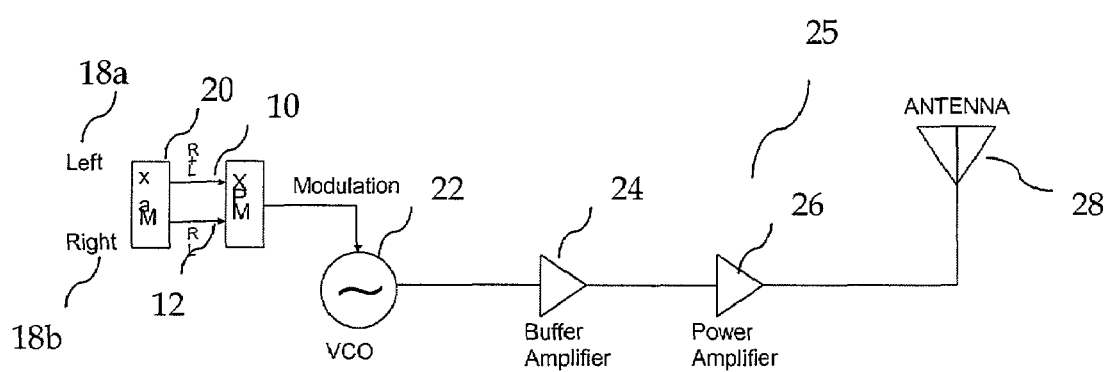
FIG. 3 illustrates a circuit schematic for a transmitter of a conventional single carrier transmission system.

Referring to FIG. 3, a circuit schematic 25 for a transmitter of a conventional single carrier transmission system is shown. The left and right audio signals (18a-b) are all pre-processed through a matrix 20 to generate (L−R) 12 and (L+R) 140 signals before they are fed into the MPX system. The signals are modulated by voltage controlling the center frequency of a RF voltage controlled oscillator (VCO) 22. The outgoing signal from the VCO 22 goes through a buffer amplifier 24 and a power amplifier 26 to boost up the amplitude of the signal for efficient radiation by an antenna 28.

Figure 4:
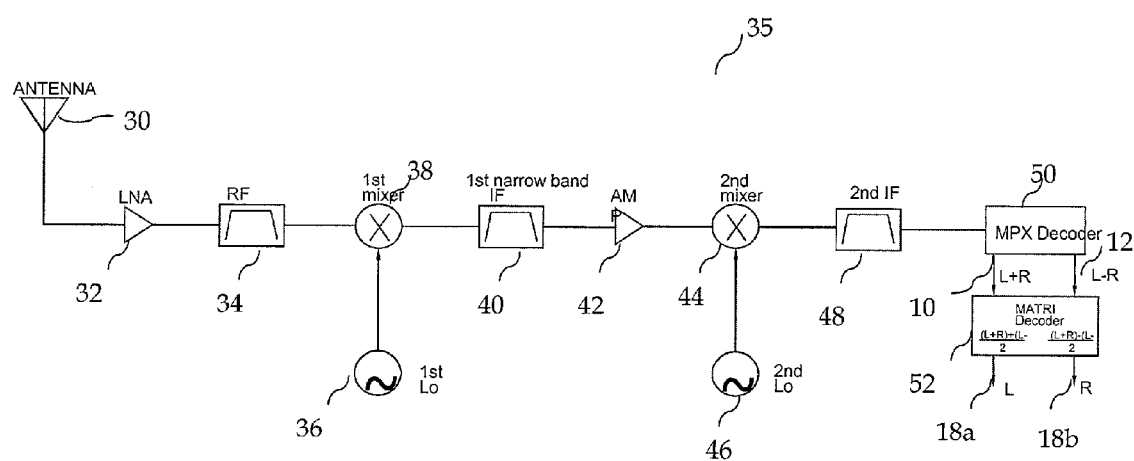
FIG. 4 illustrates a circuit schematic for a receiver of the conventional single carrier transmission system.

Referring to FIG. 4, a circuit schematic 35 for a receiver of the conventional single carrier transmission system is shown. On the receiving end of a traditional MPX system, a conventional super-heterodyne architecture is used. The RF signal picked up by an antenna 30 would be amplified by the low noise amplifier (LNA) 32 first. After passing through the RF image rejection filter 34, the signal will beat with the first local oscillator (LO) 36 in a mixer 38 and pass a first narrow band filter 40 to down-convert the RF signal to a first intermediate frequency (IF). The traditional filter 40 is designed to have narrow bandwidth in nature to reduce possible signal interference. For the purpose of adjacent channel signal filtering, the signal of the first IF will be further down-converted to a second IF through an amplifier 42, a second mixer 44, and a second LO 46. After a demodulation process at a second IF filter 48, the MPX signal would be recovered. This MPX signal will go through a MPX decoder 50 to reconstruct the (L−R) 12 and (L+R) 10 signals, and further through a matrix decoder 52 to regenerate the two separate left and right channels of signals (18a-b). However, during the RF conversion and demodulation processes, due to non-linear effect of active devices and non-linear phase effect of filtering, the MPX and matrix decoding cannot be perfectly achieved. Audio channel unbalancing and pilot tone distortion could be easily found.

Figure 5:
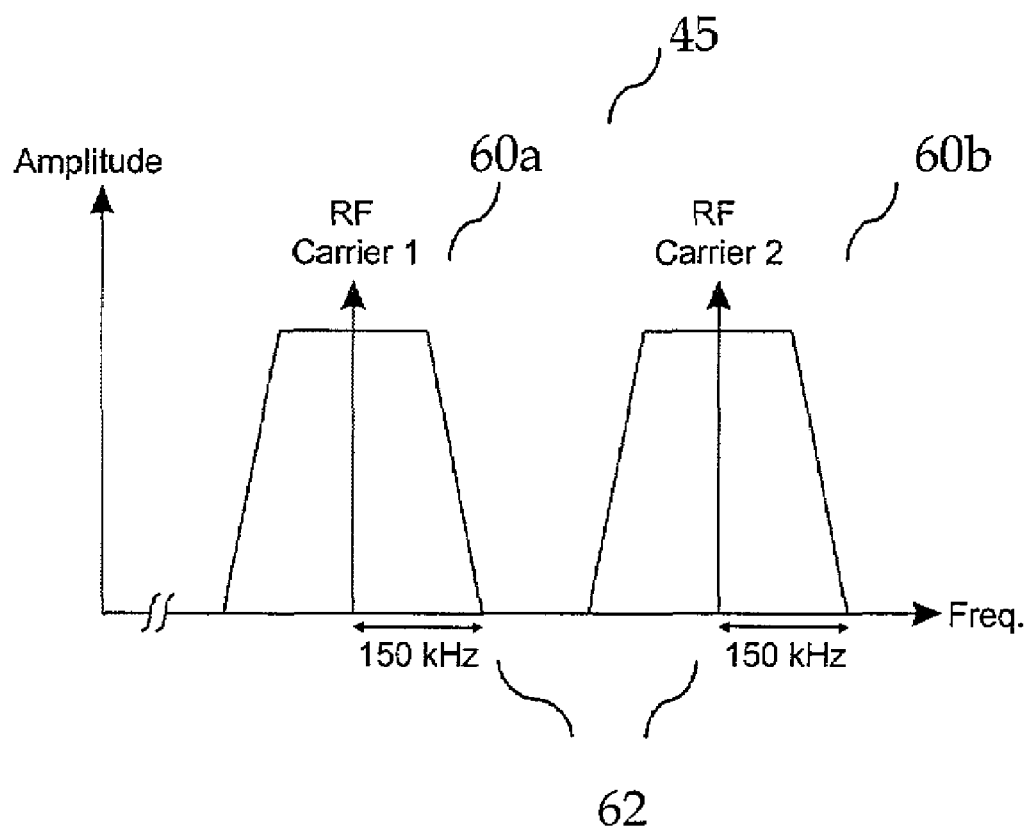
FIG. 5 illustrates a dual-carrier radio frequency spectrum for carrying signals of a dual-carrier data transmission system according to one example of the present invention.

Referring to FIG. 5, a diagram 45 illustrates a dual-carrier radio frequency spectrum for carrying signals of a dual-carrier data transmission system according to one example of the present invention. One example of the present invention uses dual RF carriers (60a-b) for transmitting the L and R signals. The left and right channels are individually and independently carried by the two base band carriers (60a-b). The frequency deviation 62 for each signal is about 150 kHz. Comparing to the conventional system, various benefits are achieved. For instance, because of the independent modulation of each independent RF carrier, no pre-processing on the L and R channels is required. Moreover, since the pilot tone is no longer needed, distortion caused by the pilot tone would disappear as well. Without the pilot tone, a base band frequency response can now be higher than the pilot tone frequency (e.g., around 20 kHz to 25 kHz). Therefore, higher frequency response systems (50 Hz to 20 kHz), which are useful particularly for high quality audio signals, can be attained. Moreover, the frequency deviation can be lifted up to 150 kHz as comparing with a mere 35 kHz deviation of the (L+R) signal as shown in FIG. 1, thus significantly improving the S/N ratio for the recovered signal.

Figure 6:
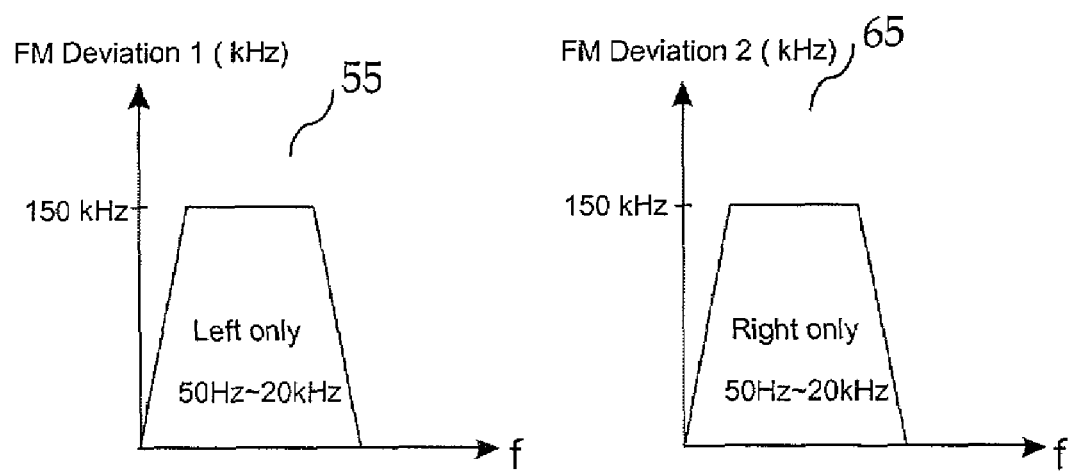
FIG. 6 illustrates a dual-carrier base band spectrum showing left and right signals transmitted thereon by a dual-carrier data transmission system according to one example of the present invention.

FIG. 6 further illustrates a dual-carrier base band spectrum for left and right signals (55 and 65) transmitted by the dual-carrier data transmission system.

Figure 7:
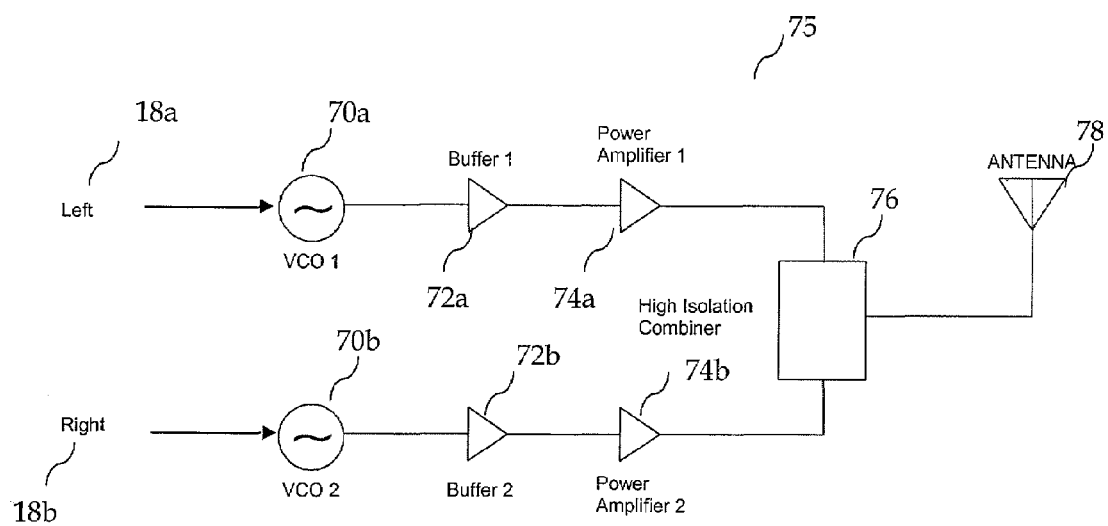
FIG. 7 illustrates a circuit schematic for a transmitter of the dual-carrier transmission system according to one example of the present invention.

FIG. 7 illustrates a circuit schematic 75 for a transmitter of the dual-carrier data transmission system according to one example of the present invention. In the dual-carrier wireless transmitter system implemented with the use of dual base band carriers, the left and right channels (18a-b) can be used for either analogue or digital signals. The FM modulation is achieved by two VCOs (70a-b). In one example, the RF carrier frequency of each channel is equal to the corresponding VCO frequency. For temperature and frequency stability issues, the VCOs can be either dielectric resonator oscillators (DRO) or phase locked loop (PLL) oscillators. After the modulation, both left and right channel VCO signals would be amplified by the buffer amplifiers (72a-b) and power amplifiers (74a-b). The amplified RF carriers would then be combined together by a high isolation combiner 76 to reduce the intermodulation distortion before feeding the final signal to an antenna 78 for radiation emission.

Figure 8:
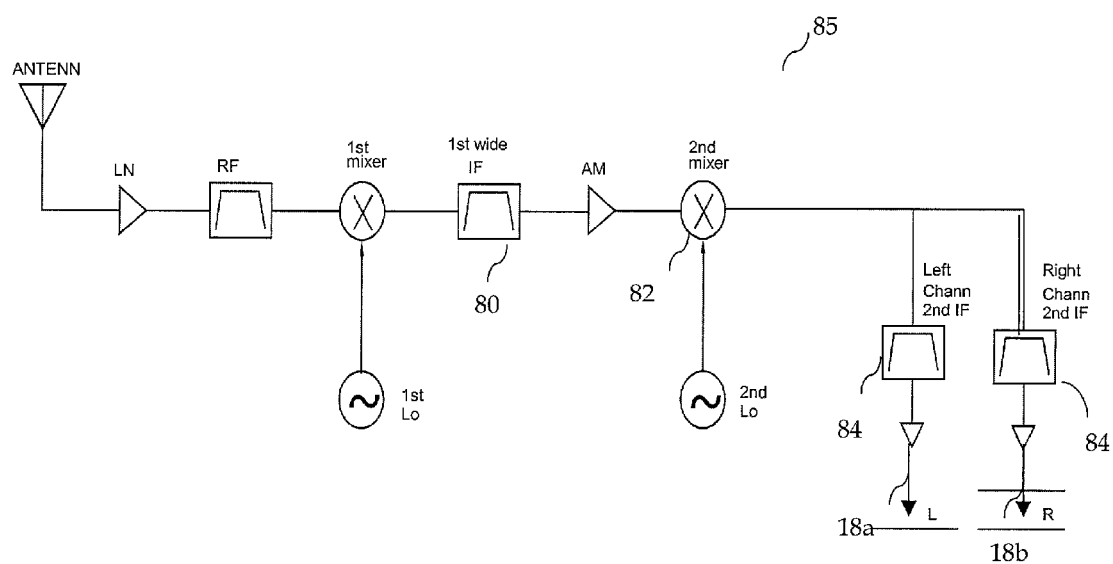
FIG. 8 illustrates a circuit schematic for a receiver of the dual-carrier transmission system according to one example of the present invention.

FIG. 8 illustrates a circuit schematic 85 for a receiver system of the dual-carrier data transmission system according to one example of the present invention. On the receiving side, the dual-carrier receiver system is similar to that described in FIG. 4 except that a wide bandwidth IF filter 80 is used in order to cover both RF carriers instead of a narrow band IF filter. After the second IF conversion in the second mixer 82, the two separate carriers can be discriminated by two different second IF filters (84a-b) for channel filtering and demodulation. After the independent demodulation processes, the left and right signals can be clearly separated and fully regenerated. It is noted that since the dual-carrier receiver system has a similar architecture as the conventional single carrier super-heterodyne receiver, the dual-carrier receiver system can easily be back compatible to the single carrier system if one of the second IF filters is disabled.

In the present dual-carrier data transmission system, signal cross talks and pilot tone distortion are reduced, thereby improving the quality of the received signals. Therefore, the system is ideal for applications that require simultaneous transmission of data from separate sources. In contrast, the conventional MPX system is incapable of achieving the same results because the signal cross talk and tone distortion may cause data glitches and jittering, which would downgrade the throughput of the wireless link between the source and the receiving end.

Figure 9:
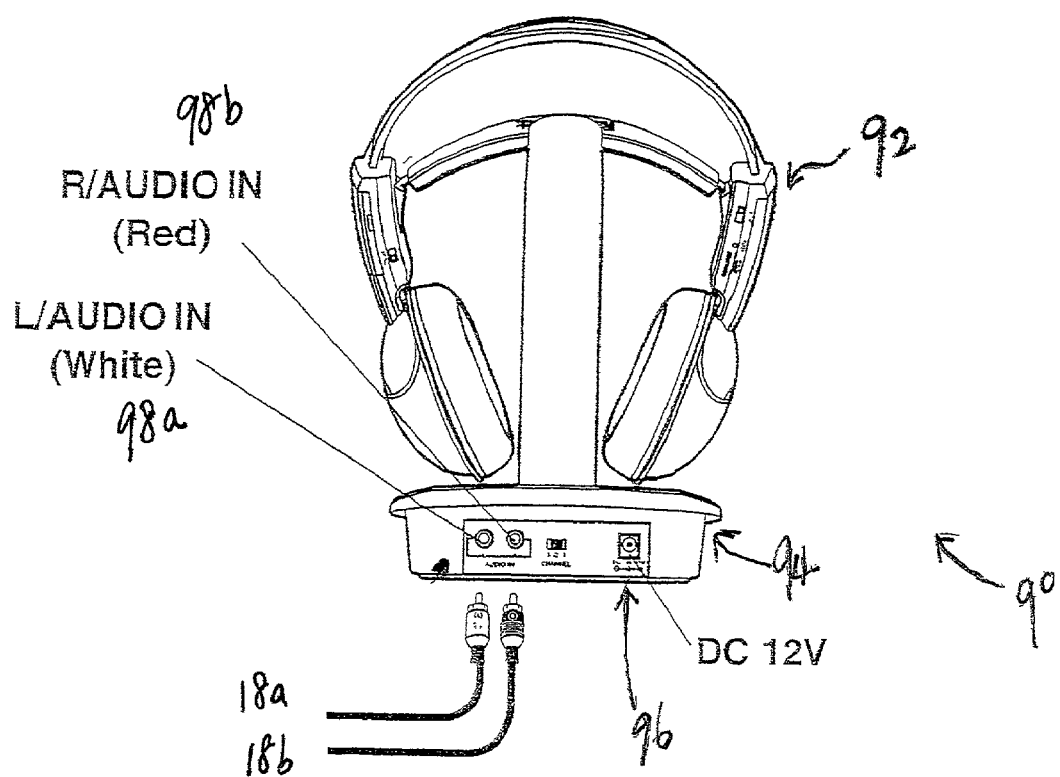
FIG. 9 illustrates a wireless headphone system according to one example of the present invention.

Various electronic instruments can incorporate the above-described invention for wireless communications. Referring to FIG. 9, for example, a 900 MHz wireless stereo headphone system 90 implemented with the present invention can use a carrier band between 911.4 to 918.4 MHz to deliver high-quality stereo sound up to a range of 150 feet. The headphone system 90 may have one or more selectable channels, Phase-Locked Loop circuitry, and built-in antenna to provide precise tuning. For the receiver 92, the sensitivity is less than 2 µV with a 20 dB signal-to-noise (S/N) ratio, and for the transmitter 94, the frequency response are set between 50 Hz to 20 kHz. The S/N ratio at −50 dBm is more than 60 dB (A weight). As a result, the audio distortion is less than 2%. In this particular wireless stereo headphone system 90, the headphone 92 is operated on two rechargeable battery packs, and the transmitter 94 uses a 12V power supply source 96 and receives audio inputs through left and right audio input jacks 98a-b for receiving the left and right channel audio signals 18a-b.

Figure 10:
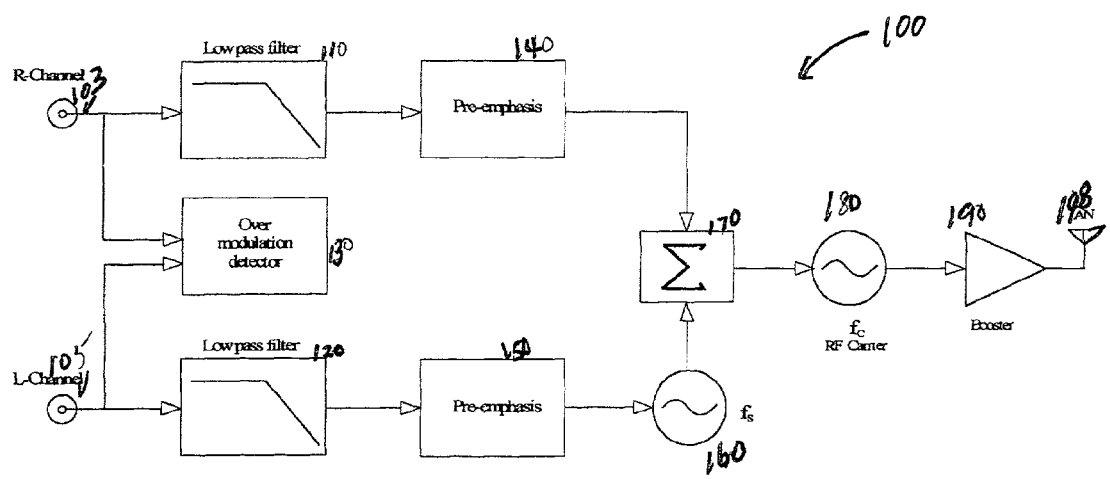
FIG. 10 is a functional block diagram of a modulation transmitter of a wireless stereophonic transmission system according to another example of the present invention.
Figure 11:
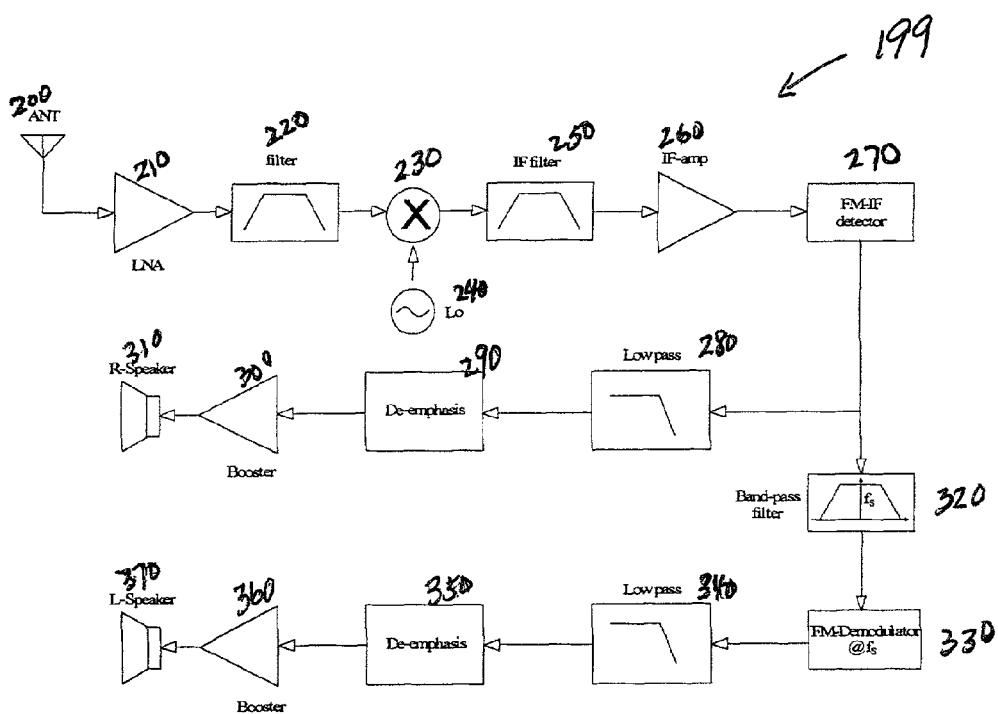
FIG. 11 is a functional block diagram of a receiver of a wireless stereophonic transmission system according to another example of the present invention.

FIGS. 10-11 illustrate alternative embodiments of the present invention as described in detail below.

More particularly, FIG. 10 illustrates a functional block diagram 100 of a modulation transmitter of a wireless stereophonic transmission system according to another example of the present invention. Both right 103 and left 105 audio channel are pre-processed by their respective low pass filters, items110 and 120 respectively, to eliminate any non-audible interference signal. An over-modulation detector 130 is used to prompt the user on how to adjust the audio signal level to interface with the transmitter. A pre-emphasis block for each channel, 140 and 150 respectively, provide better noise immunity. The left audio channel signal is input to the FM block 160. The FM block in the preferred embodiment is a VCO (voltage controlled oscillator) with carrier frequency in the 30 k to 80 kHz range.

Once the left audio channel 105 is transformed to a higher frequency by the FM block 160, this signal is then combined with the pre-processed right audio channel 103 signal at 170. In frequency domain, these two signals occupy different frequency bands and therefore do not interfere with each other. This newly combined signal is termed the new composite signal. This composite signal is then combined at 180 on an RF carrier. This RF carrier should be very stable and therefor the preferred embodiment uses a frequency generator which is either a DRO (dielectric resonator oscillator), synthesized VCO or a crystal oscillator. The frequency modulated RF signal is then put through an amplifier and transmitted through antenna 198.

FIG. 11 is a functional block diagram 199 of a receiver of a wireless stereophonic transmission system according to another example of the present invention. The system is a superheterodyne receiver with good spurious signal rejection such as image rejection and channel selectivity. The antenna 200 receives any signal within the desired frequency band of operation. The LNA (low noise amplifier) 210 is used to amplify the weak signal picked up by the antenna to increase the sensitivity of the receiver. RF filter 220 is used to filter out any unwanted RF signal with image rejection effect. The down-conversion process is realized by the mixer 230. A highly stable synthesized LO (local oscillator) 240 generates a signal which is mixed with the RF signal amplified by the LNA in the mixer 230 to generate the desired IF (intermediate frequency). The preferred embodiment has a system IF of 10.7 MHz.

IF filter 250 is used to improve the selectivity of the IF signal by narrowing the bandwidth of operation. IF-amp 260 increases the power of the IF signal. The FM IF detector 270, an integrated circuit, is used to demodulate the RF signal to the base band signal. This base band signal will then be of the same format of the composite signal used to modulate the RF carrier in the transmission side.

Once the composite signal is recovered by the FM detector, the right channel is discriminated out by simple low pass filter 280. This signal will then be de-emphasized at 290 to compensate the frequency response during pre-emphasis in the transmission side, and the signal is amplified up by an audio amplifier 300 before feeding this signal to the speaker 310. By using a band pass filter 320, the left channel audio frequency modulated carrier in the frequency range of 30 k to 80 kHz range can be discriminated out. This sub-carrier FM signal will then further demodulated by using Phase Lock Loop (PLL) 330 passed through a low pass filter 340, de-emphasis 350 and amplification at amplifier 360 before feeding to the speaker 370 for acoustic actualization.

In summary, with the additional RF carrier and increased bandwidth, the signal distortion and the system cross talk can be reduced, and the dynamic range and frequency responses of the signal sources can be significantly enhanced. Although the operating frequency is usually chosen at the industrial, scientific, medical (ISM) frequency band, such as 902 MHz-928 MHz, 2.4 GHz or higher frequency bands can also be applied.

Although the present invention is described above with respect to a stereo system, it is understood that applications of the present invention are not limited to audio systems. For instance, the technology can be used for interactive toys with simultaneous controls and interactions using a RF wireless link. Another example is a home video game wireless controller which would allow two users to get rid of the wires that link with the main disc player shared by both of them. Moreover, the data sent through separate channels does not have to be of the same type. In some situations, one channel can communicate analog signals while the other channel transmits digital data.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for transmitting two related channels of signals through the air, the method comprising:
   modulating a first channel of signals with a first carrier frequency;

amplifying the first carrier frequency modulated with the first channel of signals;

modulating a second channel of signals with a second carrier frequency;

amplifying the second carrier frequency modulated with the second channel of signals;

combining the amplified and modulated first channel of signals and the second channel of signals through a high isolation combiner, which provides a high degree of isolation therebetween;

coupling the combined signals from the high isolation combiner directly to a single antenna output;

transmitting the combined signals to a receiver system; and regenerating the first channel and the second channel of signals in the receiver system by separating one from the other.

2. A dual carrier wireless transmitter apparatus, comprising:

a first voltage controlled oscillator, having a first base band signal coupled to deviate a first oscillator frequency, thereby outputting a first modulated carrier signal;

a second voltage controlled oscillator, having a second base band signal coupled to deviate a second oscillator frequency, thereby outputting a second modulated carrier signal;

a high isolation combiner coupled to combine said first modulated carrier signal and said second modulated carrier signal directly to a single antenna output, and operable to provide a high degree of isolation therebetween;

a first amplifier coupled to amplify said first modulated carrier signal before input to said high isolation combiner, and a second amplifier coupled to amplify said second modulated carrier signal before input to said high isolation combiner.

3. The apparatus of claim 2 wherein said first voltage controlled oscillator further comprises a dielectric resonator oscillator.

4. The apparatus of claim 2 wherein said first base band signal comprises analog audio signals.

5. The apparatus of claim 4 wherein said analog audio signals comprise frequency components in the range of 50 Hz to 20 kHz.

6. A dual carrier wireless transmitter apparatus, comprising:

a first voltage controlled oscillator, having a first base band signal coupled to deviate a first oscillator frequency, thereby outputting a first modulated carrier signal, wherein said first base band signal deviates said first oscillator frequency by about 150 kilohertz;

a second voltage controlled oscillator, having a second base band signal coupled to deviate a second oscillator frequency, thereby outputting a second modulated carrier signal, and a high isolation combiner coupled to combine said first modulated carrier signal and said second modulated carrier signal to directly a single antenna output, and operable to provide a high degree of isolation therebetween.

7. A wireless receiver apparatus for demodulating a radio frequency signal, having a first modtdated carrier signal and a second modulated carrier signal, into a first base band signal and a second base band signal, comprising:

a first mixer coupled to down-convert the radio frequency signal to a first intermediate frequency signal;

a first filter coupled to filter said first intermediate frequency signal, said first filter having a pass band of sufficient width to pass both of the down-convened first and second modulated carrier signals;

a second mixer coupled to down-convert said filtered first intermediate frequency signal to a second intermediate frequency signal;

a second filter coupled to filter said second intermediate frequency signal, said second filter having a pass band of such center frequency and width as to pass only the down-converted first modulated carrier signal, and a third filter coupled to filter said second intermediate frequency signal, and having a pass band of such center frequency and width as to pass only the down-converted second modulated carrier signal.

8. The apparatus of claim 7 further comprising:

a first demodulator coupled to demodulate the filtered and down-converted first modulated carrier signal, and a second demodulator coupled to demodulate the filtered and down-converted second modulated carrier signal.

9. The apparatus of claim 7 wherein said first mixer is coupled to a first local oscillator.

10. The apparatus of claim 7 wherein said second mixer is coupled to a second local oscillator.

11. The apparatus of claim 7 wherein said second filter has a pass band of sufficient width to pass a frequency modulated signal that is deviated about 150 kilohertz.

12. The apparatus of claim 7 wherein the first base band signal comprises analog audio signals.

13. The apparatus of claim 12 wherein the analog audio signals comprise frequency components in the range of 50 Hz to 20 kHz.

14. A method of receiving and demodulating a radio frequency signal, having a first modulated carrier signal and a second modulated carrier signal, into a first base band signal and a second base band signal, comprising the steps of:

down-converting the radio frequency signal to a first intermediate frequency signal;

filtering said first intermediate frequency signal through a pass band of sufficient width to pass both or the down-converted first and second modulated carrier signals;

down-converting said filtered first intermediate frequency signal to a second intermediate frequency signal;

filtering said second intermediate frequency signal through a pass band of such center frequency and width as to pass only the down-converted first modulated carrier signal, and demodulating the first base band signal therefrom, and filtering said second intermediate frequency signal through a pass band of such center frequency and width as to pass only the down-converted second modulated carrier signal, and demodulating the second base band signal therefrom.

15. The method of claim 14 wherein said filtering said second intermediate frequency signal steps employ a pass band of sufficient width to pass a frequency modulated signal that is deviated about 150 kilohertz.

16. The method of claim 14 wherein the first base band signal comprises analog audio signals.

17. The method of claim 16 wherein the analog audio signals comprise frequency components in the range of 50 Hz to 20 kHz.

* * * * *